(12) United States Patent
Herz et al.

(10) Patent No.: US 7,138,855 B2
(45) Date of Patent: Nov. 21, 2006

(54) CIRCUIT ARRANGEMENT FOR SWITCHING A CURRENT OF AND OFF WITHOUT THE OCCURRENCE OF OVERCURRENT

(75) Inventors: Manfred Herz, Mainz (DE); Alvaro Pineda Garcia, Boppard (DE)

(73) Assignee: Schott AG, Mainz (DE)

( * ) Notice: Subject to any disclaimer, the term of this patent is extended or adjusted under 35 U.S.C. 154(b) by 0 days.

(21) Appl. No.: 10/471,342

(22) PCT Filed: Jan. 18, 2002

(86) PCT No.: PCT/EP02/00453

§ 371 (c)(1),
(2), (4) Date: May 11, 2004

(87) PCT Pub. No.: WO02/082650

PCT Pub. Date: Oct. 17, 2002

(65) Prior Publication Data

US 2005/0073336 A1    Apr. 7, 2005

(30) Foreign Application Priority Data

Mar. 8, 2001    (DE) .............................. 201 04 111 u

(51) Int. Cl.
G05F 1/10    (2006.01)
G05F 3/02    (2006.01)

(52) U.S. Cl. .................... 327/543; 327/552; 326/26; 326/27

(58) Field of Classification Search .................. 326/26, 326/27, 81, 83

See application file for complete search history.

(56) References Cited

U.S. PATENT DOCUMENTS

| 5,539,336 | A |   | 7/1996  | Nguyen et al. | 326/83 |
| 5,541,532 | A | * | 7/1996  | McCall        | 326/68 |
| 5,608,339 | A |   | 3/1997  | Fujiwara      | 326/27 |
| 5,986,463 | A | * | 11/1999 | Takiguchi     | 326/27 |

FOREIGN PATENT DOCUMENTS

| EP | 0 703 664 A1 | 3/1996  |
| EP | 0 810 732 A1 | 12/1997 |
| JP | 59147476     | 8/1984  |

* cited by examiner

*Primary Examiner*—Vibol Tan
(74) *Attorney, Agent, or Firm*—Ohlandt, Greeley, Ruggiero & Perle, L.L.P.

(57) ABSTRACT

There is provided a circuit arrangement for switching a current on and off without overcurrent. The circuit arrangement includes a current source, a load associated with the current source, a switching transistor for switching the current source on and off, where the switching transistor has a parasitic capacitance between a control electrode and a first output electrode, and a shorting device between the control electrode and the first output electrode of the switching transistor for switching off the current source. The current can be used, for example, to drive a laser diode.

6 Claims, 4 Drawing Sheets

CIRCUIT ARRANGEMENT FOR SWITCHING A CURRENT OF AND OFF WITHOUT THE OCCURRENCE OF OVERCURRENT

CROSS-REFERENCE TO RELATED APPLICATIONS

The present application is a U.S. National Phase Entry of International Application No. PCT/EP02/00453, filed Jan. 18, 2002, which in turn claims priority of German Patent Application No. 201 04 111.1, filed Mar. 8, 2001.

FIELD OF THE INVENTION

The invention relates to a circuit arrangement for switching a current on and off without overcurrent, that current being used to drive a laser diode, for example.

BACKGROUND OF THE INVENTION

Circuit arrangements for switching a current driving a load on and off are known.

FIG. 1 shows such a circuit arrangement, which uses a transistor 20' as a current source or current sink. The control electrode of the transistor 20' is connected to a DC voltage source 80'. The current source 20' is connected in series with a load 40', for example with a laser diode. A switching transistor 50', which is likewise connected in series with the current source 20', is used as a switch for the current source. The switching transistor 50', which is in the form of a field-effect transistor, for example, is connected by means of its gate electrode 51' to a driving device which comprises the transistors 75' and 70', for example. The input 1 of the driving device 70', 75' has a switch-on/switch-off signal P applied to it, as illustrated in FIG. 2, for example. Between the gate 51' and the drain electrode 52' of the switching transistor 50' there is a manufacture-dependent parasitic capacitance 60', which is also known as the Miller capacitance. As will be explained later, this parasitic capacitance is the cause of overcurrents that are brought about when the current source 20' is switched off. The gate/source voltage GS of the switching transistor 50' controls the state of the switching transistor. If this gate/source voltage GS is lower than the threshold voltage of the switching transistor 50', the current IL is interrupted by the switching transistor 50'. The gate/source voltage GS is S controlled by means of the driving device 70', 75'. However, when the switching transistor 50' and hence the current source 20' are disconnected, an overcurrent, also called a current spike, is produced which has its origins in the parasitic capacitance 60' of the switching transistor 50'. This is because a falling edge of the gate/source voltage GS on the switching transistor 50' (the profile of said gate/source voltage being shown in FIG. 4) causes the parasitic capacitance 60' to transfer the sudden voltage change on the control electrode 51' to the output electrode 52' of the switching transistor 50' and to drive the transistor 20' at a higher level. This causes an overcurrent through the load 40', as shown in FIG. 3 at the time $t_a$. The overcurrent flows until the parasitic capacitance's charge has been reversed. The time $t_a$ characterizes the time at which the switch-off signal is applied to the input 1 of the driving device 70', 75'. In the case of certain applications, such current spikes can result in the load 40' being destroyed, as can be the case with a laser diode, for example.

SUMMARY OF THE INVENTION

The invention is now based on the object of improving the initially described circuit arrangement for switching a current on and off such that overcurrents can be avoided when a current source is switched off.

The invention solves this technical problem with the features of claim 1.

Accordingly, a circuit arrangement for switching a current on and off without overcurrent is provided. The circuit arrangement has a current source, a load associated with the current source and a switching transistor for switching the current source on and off. Depending on manufacture, the switching transistor contains a parasitic capacitance between the control electrode and a first output electrode, which causes charge-reversal currents when the current source is switched off. A shorting device, connected between the control electrode and the first output electrode of the switching device, for switching off the current source can be used to prevent the charge-reversal currents from resulting in overcurrents in the load.

Expediently, the shorting device is in the form of a transistor whose control electrode can have a switch-on/switch-off signal applied to it. One output electrode of the shorting device is connected to the first output electrode of the switching transistor, and the other output electrode of the shorting device is connected to the control electrode of the switching transistor. In this way, the shorting device shorts the switching transistor and hence switchs off the current source.

In order to be able to shorten the input and output cycles, a pull-up device is connected in parallel with the shorting device and ensures that the potential on the switching transistor's control electrode can be raised at the switch-on time.

The current source, the switching transistor, the shorting device and/or the pull-up device can be in the form of bipolar transistors, field-effect transistors, particularly MOS transistors, or combinations of these technologies.

The circuit arrangement is suitable particularly for driving a laser diode as a load.

BRIEF DESCRIPTION OF THE DRAWINGS

The invention is explained in more detail below with reference to an exemplary embodiment in conjunction with the appended drawings, in which.

DETAILED DESCRIPTION OF THE PREFERRED EMBODIMENT

Figure 1:
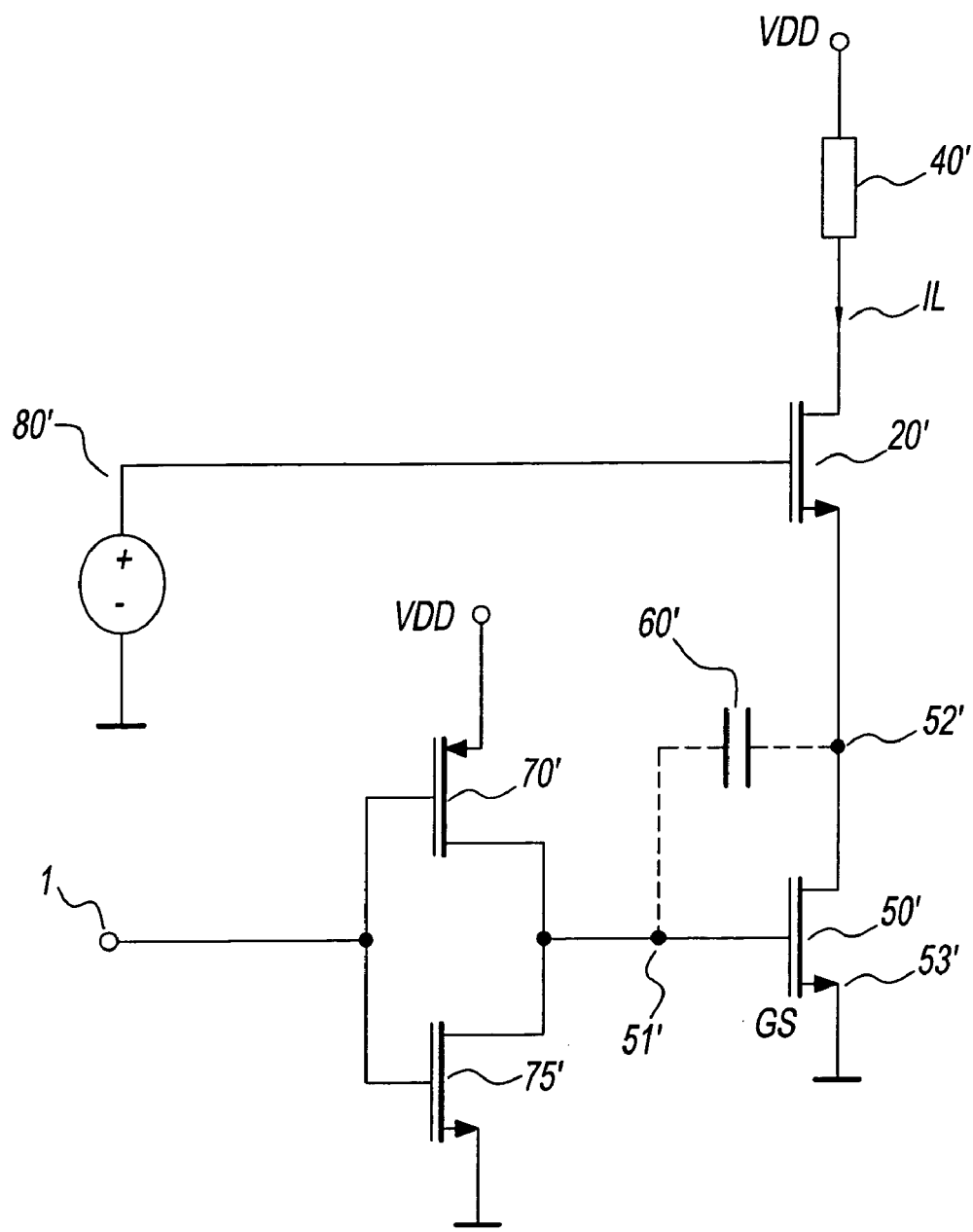
FIG. 1 shows a circuit arrangement for switching a current on/off in accordance with the prior art.
Figure 2:
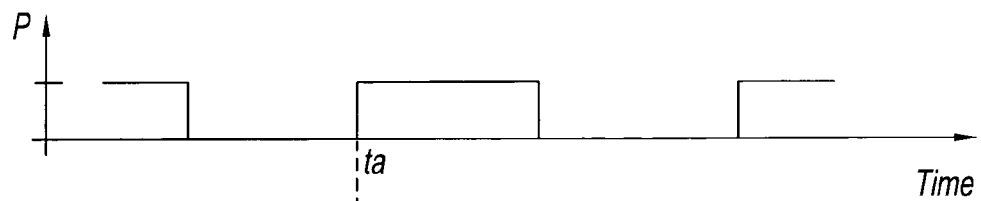
FIG. 2 shows the time-dependency diagram for a switch-on/switch-off signal.
Figure 3:
FIG. 3 shows the load current IL through the load 40'.
Figure 4:
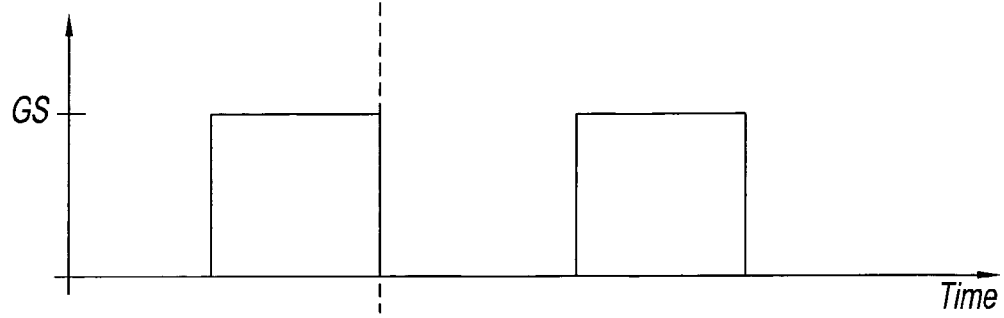
FIG. 4 shows the time-dependency diagram of the potential profile on the control electrode of the switching transistor shown in FIG. 1.
Figure 5:
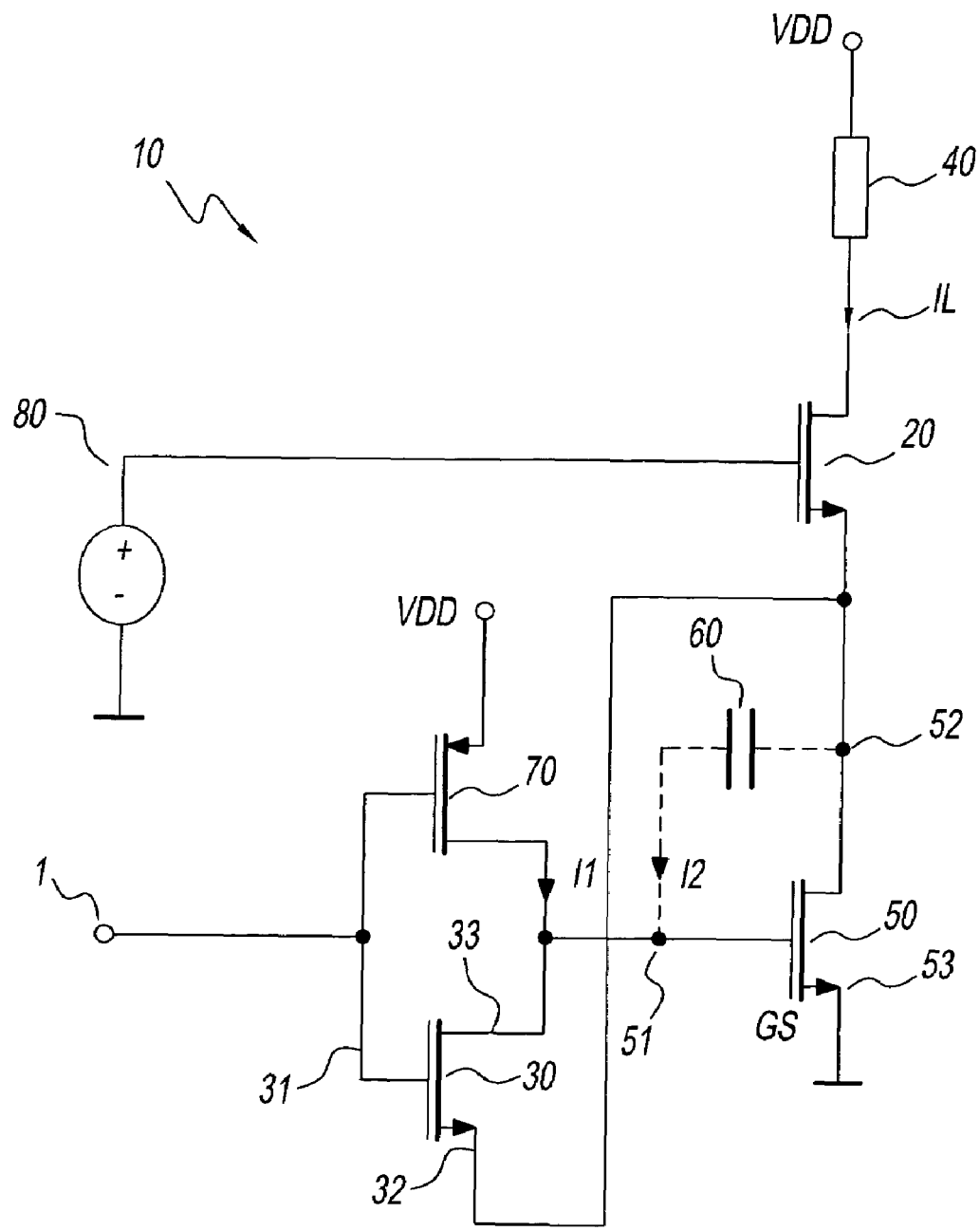
FIG. 5 shows a circuit arrangement in accordance with the invention.

FIG. 5 shows a circuit arrangement 10 that contains components of the circuit arrangement shown in FIG. 1. A load, for example a laser diode 40, is connected to the drain electrode of an exemplary n-channel field-effect transistor 20 operated as a current source. The gate of the current source 20 has a constant voltage applied to it that is delivered by the DC voltage source 80. The source electrode of the current source 20 is connected to the drain electrode 52 of an exemplary n-channel field-effect transistor acting as a switching transistor 50, so that the load 40, the current source 20 and the switching transistor 50 form a series circuit. The source electrode 53 of the switching transistor 50 is connected to ground. In addition, there is a shorting transistor 30, for example in the form of an n-channel field-effect transistor, whose drain electrode 33 is connected to the gate 51 of the switching transistor 50, whereas the source electrode 32 of the shorting transistor 30 is connected directly to the drain electrode 52 of the switching transistor.

It is important to point out that the shorting transistor 30, unlike the circuit arrangement shown in FIG. 1, connects the gate 51 of the switching transistor 50 in the conducting state not to ground but to the drain electrode 52 of the switching transistor 50. In this way, as will be explained in detail later, the manufacture-dependent parasitic capacitance 60 between the gate 51 and the drain electrode 52 of the switching transistor 50 can be shorted at the time at which the switching transistor 50 is switched off, which simultaneously connects the switching transistor 50 to a two-terminal network across which the threshold voltage drops.

Figure 6:
FIG. 6 shows the time-dependency diagram for a switch-on/switch-off signal in accordance with FIG. 2.

The gate 31 of the shorting transistor 30 is connected to an input connection 1 to which the switch-on/switch-off signal P shown in FIG. 6 can be applied. The shorting transistor 30 can have a pull-up element 70 connected in parallel with it, for example a pull-up transistor in the form of a p-channel field-effect transistor whose gate is likewise connected to the input 1 of the circuit arrangement. Unlike the shorting transistor 30, the pull-up transistor 70 is in the form of a p-channel field-effect transistor. The source electrode of the pull-up transistor 70 is connected to the operating voltage VDD, whereas the drain electrode is connected to the gate 51 of the switching transistor 50. In this way, the gate 51 of the switching transistor 50 can be pulled more quickly at the switch-on time to a potential which is above the threshold voltage of the switching transistor 50, which means that the switching transistor can switch on more quickly and hence can switch on the current source 20 more quickly.

A detailed explanation will now be given, in conjunction with FIG. 6 to 9, of the way in which the circuit arrangement 10 works when the current is switched off.

Figure 7:
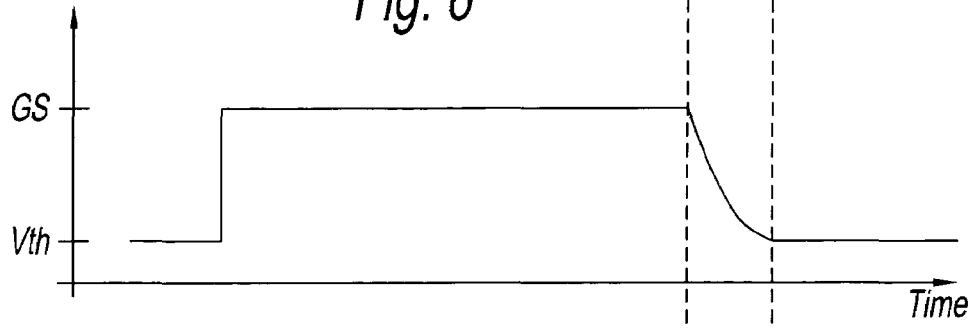
FIG. 7 shows the time-dependency diagram of potential profile on the control electrode of the switching transistor shown in FIG. 5.
Figure 9:
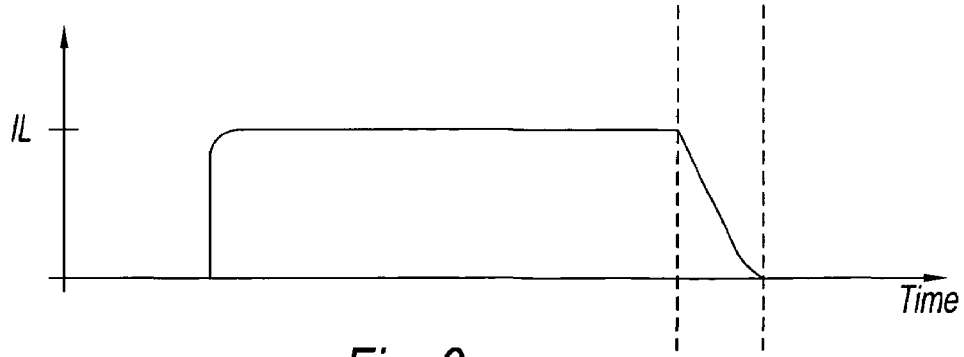
FIG. 9 shows the time-dependency diagram for a load current without overcurrent.

Consideration will first be given to the phase during which the switching transistor 50 and hence the current source 20 are on. During this time, the switch-on signal P shown in FIG. 6 is applied to the input 1 and adopts a low level during this time in the elucidated example. On account of the low level, the shorting transistor 30 switchs off and the potential on the gate 51 of the switching transistor 50 is held at operating voltage by means of the pull-up transistor 70, which is on during this period, as shown in FIG. 7. Since the operating voltage is chosen to be higher than the threshold voltage of the switching transistor 50, a current consequently flows through the switching transistor 50 and the load current IL flows through the load 40 and the current source 20, as shown in FIG. 9. In other words, the current source 20 is on.

It will now be assumed that a switch-off signal P is applied to the input 1 of the circuit arrangement at the time $t_1$, so that the potential at the input 1 changes from low to high. This time $t_1$ is shown in FIG. 6.

Figure 8:
FIG. 8 shows the time-dependency diagram of current through the parasitic capacitance shown in FIG. 5.

At this time, the shorting transistor 30 starts to conduct and connects the gate 51 of the switching transistor 50 to the drain electrode 52. Consequently, the charge-reversal current I2 in the parasitic capacitance 60 flows via the shorting transistor 30, as shown in FIG. 8. This charge-reversal current thus no longer flows as a current spike through the load 40. The current I1 flowing via the pull-up transistor 70 drains to ground essentially through the shorting transistor 30 and then via the switching transistor 50. This phase lasts until the time $t_2$, at which the voltage on the gate 51 of the switching transistor 50 has reached the latter's threshold voltage Vth. This phase is shown in FIG. 7 by the falling edge of the gate/source voltage between the times $t_1$ and $t_2$. As soon as the voltage on the drain electrode 52 of the switching transistor 50 has become high enough to achieve a dip below the threshold voltage Vth of the current source 20, the current source 20 is switched off. Since the shorting transistor 30 shorts the gate 51 and the drain electrode 52, the same potential is applied to both points. Consequently, as mentioned, the charge-reversal current in the parasitic capacitance 60 can flow via the shorting transistor 30. The load current IL, which is free from overcurrent, shown in FIG. 9 thus falls to almost zero between the times $t_1$ and $t_2$. The condition for the load current IL to be disconnected by the switching transistor 50 is that the constant voltage applied to the gate of the current source 20 is lower than the sum of the threshold voltages of the current source 20 and the switching transistor 50.

To be able to speed up the input and output switching processes further or to be able to extend the operating range, the potentials on the gate of the current source or on the gate of the switching transistor 50 can be lowered when switching off or raised when switching on by further permanently connected or dynamically connectable current sinks.

LIST OF REFERENCES

1 Input
10 Circuit arrangement
20, 20' Current source
30 Shorting device
31 Gate
32 Source electrode
33 Drain electrode
40, 40' Load, laser diode
50, 50' Switching transistor
51, 51' Control electrode, gate
52, 52' Drain electrode
53, 53' Source electrode
60, 60' Parasitic capacitance
70', 75' Driving device
70 Pull-up transistor
80, 80' DC voltage source
VDD Operating voltage
IL Load current
GS Gate/source voltage
P Switch-on/switch-off signal

The invention claimed is:

1. A circuit arrangement, comprising:
a current source;
a load associated with the current source;
a switching transistor that switches the current source on and off, having a control electrode, a first output electrode, and a parasitic capacitance between the control electrode and the first output electrode; and a shorting device, between the control electrode and the first output electrode, that discharges the parasitic capacitance when the switching transistor switches off the current source.

2. The circuit arrangement as claimed in claim 1, wherein the shorting device comprises a transistor having:
- a control electrode for having a switch-on/switch-off signal applied to it;
- an output electrode connected to the first output electrode; and
- an output electrode connected to the control electrode of the switching transistor.

3. The circuit arrangement as claimed in claim 1, wherein the shorting device has an associated pull-up device.

4. The circuit arrangement as claimed in claim 1, wherein one or more of the current source, the switching transistor, or the shorting device are in a form selected from the group consisting of a bipolar transistor and a field-effect transistor.

5. The circuit arrangement as claimed in claim 1, wherein the load is a laser diode.

6. The circuit arrangement as claimed in claim 1, wherein the current is switched off by the switching transistor if a constant voltage applied to a control electrode of the current source is lower than a sum of threshold voltages of the current source and the switching transistor.

* * * * *